United States Patent
Brandl et al.

(10) Patent No.: US 9,748,450 B2
(45) Date of Patent: Aug. 29, 2017

(54) METHOD OF PRODUCING AN OPTOELECTRONIC COMPONENT

(71) Applicant: OSRAM Opto Semiconductors GmbH, Regensburg (DE)

(72) Inventors: Martin Brandl, Kelheim (DE); Markus Burger, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/902,105

(22) PCT Filed: Jul. 3, 2014

(86) PCT No.: PCT/EP2014/064221
§ 371 (c)(1),
(2) Date: Dec. 30, 2015

(87) PCT Pub. No.: WO2015/001037
PCT Pub. Date: Jan. 8, 2015

(65) Prior Publication Data
US 2016/0163932 A1    Jun. 9, 2016

(30) Foreign Application Priority Data

Jul. 3, 2013    (DE) .................. 10 2013 212 928

(51) Int. Cl.
*H01L 33/50*    (2010.01)
*H01L 33/60*    (2010.01)
(Continued)

(52) U.S. Cl.
CPC .......... *H01L 33/505* (2013.01); *H01L 33/005* (2013.01); *H01L 33/502* (2013.01);
(Continued)

(58) Field of Classification Search
CPC combination set(s) only.
See application file for complete search history.

(56) References Cited

U.S. PATENT DOCUMENTS

2005/0242355 A1    11/2005  Guenther et al.
2010/0140648 A1    6/2010   Harada et al.
(Continued)

FOREIGN PATENT DOCUMENTS

DE    10 2010 028 407 A1    11/2011
DE    11 2011 100 376 T5     11/2012
(Continued)

OTHER PUBLICATIONS

First Office Action dated Mar. 28, 2017, of corresponding Chinese Application No. 201480037849.4 in English.

*Primary Examiner* — Kyoung Lee
*Assistant Examiner* — Ratisha Mehta
(74) *Attorney, Agent, or Firm* — DLA Piper LLP (US)

(57) ABSTRACT

A method of producing an optoelectronic component includes providing an optoelectronic semiconductor chip having a mask layer arranged on an upper side of the optoelectronic semiconductor chip; providing a carrier having walls arranged on a surface of the carrier, the walls laterally limiting a receiving region; arranging an optoelectronic semiconductor chip in the receiving region, wherein a bottom side of the optoelectronic semiconductor chip faces the surface of the carrier; filling a region of the receiving region surrounding the optoelectronic semiconductor chip with an optically reflective material up to a height that lies between the upper side of the optoelectronic semiconductor chip and an upper side of the mask layer; removing the mask layer to create a free space in the optically reflective material; and introducing a wavelength-converting material into the free space.

14 Claims, 4 Drawing Sheets

(51) Int. Cl.
*H01L 33/00* (2010.01)
*H01L 33/62* (2010.01)
*H01L 33/48* (2010.01)

(52) U.S. Cl.
CPC .............. *H01L 33/60* (2013.01); *H01L 33/62* (2013.01); *H01L 33/486* (2013.01); *H01L 2933/0033* (2013.01); *H01L 2933/0041* (2013.01); *H01L 2933/0058* (2013.01); *H01L 2933/0066* (2013.01)

(56) References Cited

U.S. PATENT DOCUMENTS

| | | | | |
|---|---|---|---|---|
| 2011/0180906 | A1* | 7/2011 | Wessels | B82Y 10/00 257/618 |
| 2011/0309388 | A1 | 12/2011 | Ito et al. | |
| 2012/0220082 | A1* | 8/2012 | Ng | H01L 21/561 438/124 |
| 2012/0256215 | A1* | 10/2012 | Liou | H01L 33/58 257/98 |
| 2012/0256315 | A1 | 10/2012 | Meyer et al. | |
| 2012/0302124 | A1 | 11/2012 | Imazu | |
| 2013/0049049 | A1 | 2/2013 | Choi | |
| 2013/0105837 | A1* | 5/2013 | West | H01L 25/0753 257/98 |
| 2013/0113010 | A1 | 5/2013 | Brunner et al. | |
| 2013/0134473 | A1* | 5/2013 | Brunner | H01L 24/73 257/99 |
| 2013/0256711 | A1* | 10/2013 | Joo | H01L 33/486 257/88 |

FOREIGN PATENT DOCUMENTS

| | | |
|---|---|---|
| DE | 10 2012 107 547 A1 | 2/2013 |
| EP | 1 592 074 A2 | 11/2005 |
| EP | 2 511 963 A2 | 10/2012 |

* cited by examiner

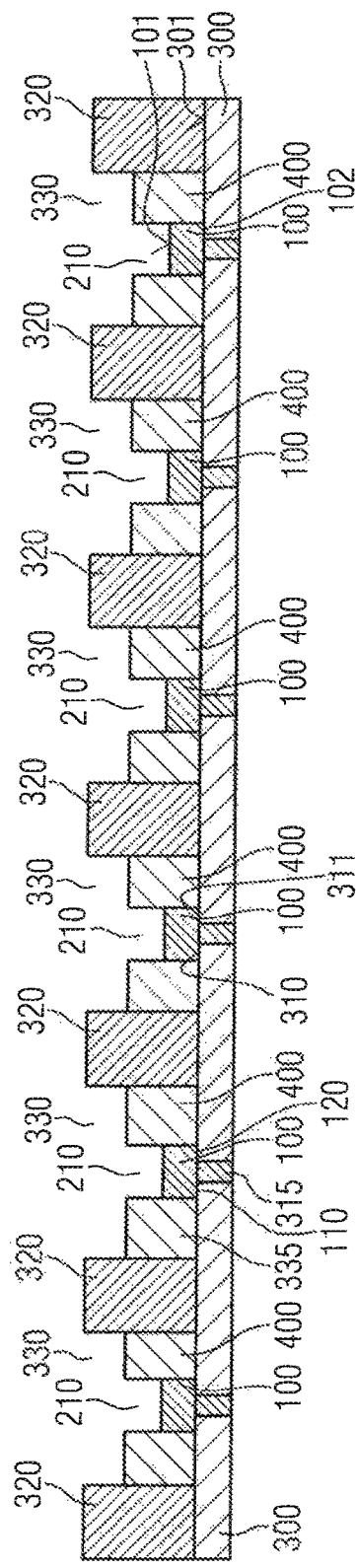
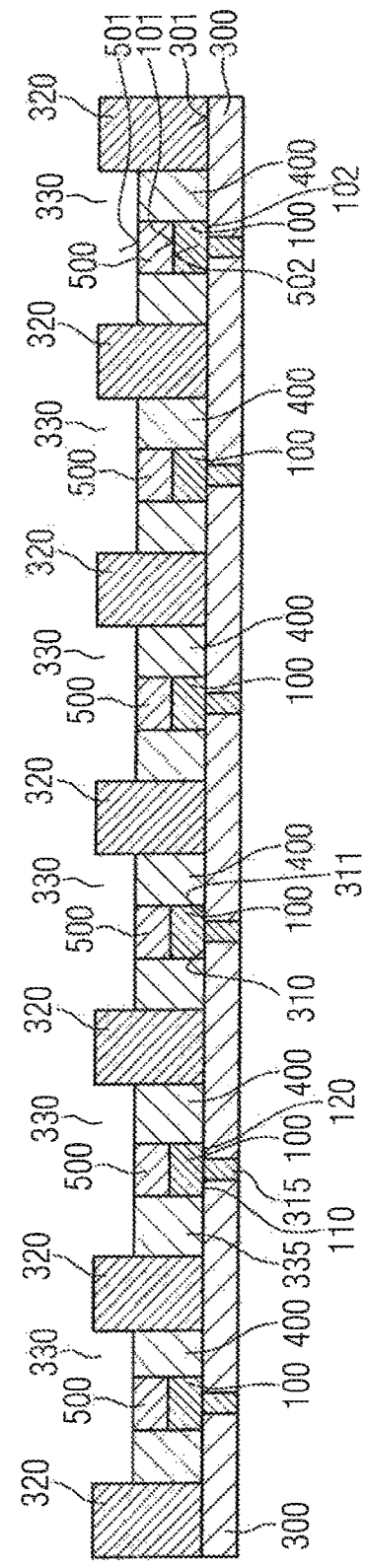

METHOD OF PRODUCING AN OPTOELECTRONIC COMPONENT

TECHNICAL FIELD

This disclosure relates to a method of producing an optoelectronic component.

BACKGROUND

It is known for optoelectronic components comprising optoelectronic semiconductor chips such as light-emitting-diode components comprising LED chips to arrange wavelength-converting elements on radiation-emitting upper sides of the optoelectronic semiconductor chips. Such wavelength-converting elements are also referred to as chip lever converters (CLC). In that context, the wavelength-converting element respectively converts a wavelength of an electromagnetic radiation emitted by the optoelectronic semiconductor chip to generate electromagnetic radiation such as visible light having one or several different wavelengths.

It is known to produce such wavelength-converting elements in the form of stamped ceramic small plates. That method, however, involves high production costs. It is also known to produce wavelength-converting elements by screen or stencil printing. The wavelength-converting elements thus obtainable, however, do not comprise clearly defined outer edges.

It is known to embed optoelectronic semiconductor chips of optoelectronic components into layers of reflective materials that are flush with a radiation-emitting upper side of the optoelectronic semiconductor chip or with an upper side of a wavelength-converting element arranged above the radiation-emitting upper side. By the embedding, a stronger luminous flux emitted at the upper side of the optoelectronic component may be achieved. However, embedding requires clearly defined outer edges of a potential wavelength-converting element of the optoelectronic component.

It could therefore be helpful to provide an improved method of producing an optoelectronic component.

SUMMARY

We provide a method of producing an optoelectronic component including providing an optoelectronic semiconductor chip having a mask layer arranged on an upper side of the optoelectronic semiconductor chip; providing a carrier having walls arranged on a surface of the carrier, the walls laterally limiting a receiving region; arranging an optoelectronic semiconductor chip in the receiving region, wherein a bottom side of the optoelectronic semiconductor chip faces the surface of the carrier; filling a region of the receiving region surrounding the optoelectronic semiconductor chip with an optically reflective material up to a height that lies between the upper side of the optoelectronic semiconductor chip and an upper side of the mask layer; removing the mask layer to create a free space in the optically reflective material; and introducing a wavelength-converting material into the free space.

BRIEF DESCRIPTION OF THE DRAWINGS

FIG. 6 shows a section through the carrier after removing the mask layers arranged on the optoelectronic semiconductor chips.

FIG. 7 depicts a section through the carrier after filling a wavelength-converting material into the free spaces obtained by removing the mask layer.

Figure 1:
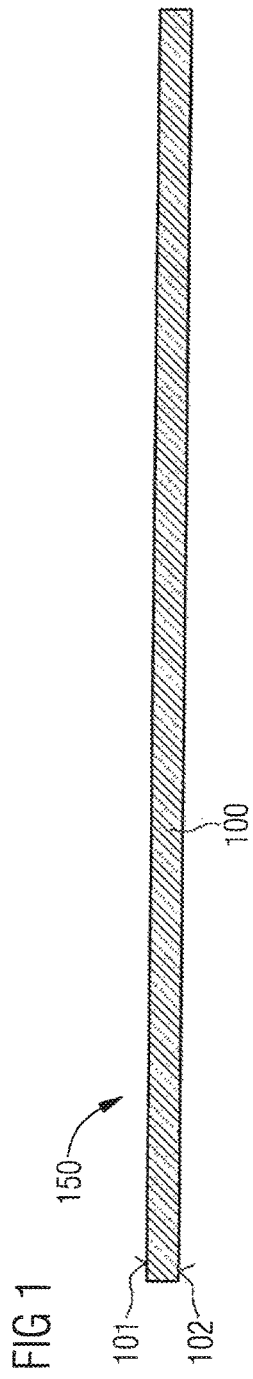
FIG. 1 depicts a section through a plurality of optoelectronic semiconductor chips arranged in a wafer.

REFERENCE LIST 10 optoelectronic component
100 optoelectronic semiconductor chip
101 upper side
102 bottom side
110 first electrical contact region
120 second electrical contact region
150 wafer
200 mask layer
201 upper side
202 bottom side
210 free space
300 carrier
301 surface
310 first electrical contact pad
311 second electrical contact pad
315 isolator
320 wall
330 receiving region
335 surrounding region
340 parting plane
400 optically reflective material
410 height
500 wavelength-converting material
501 upper side
502 bottom side
600 casting material

DETAILED DESCRIPTION

Our method of producing an optoelectronic component comprises steps that provide an optoelectronic semiconductor chip with a mask layer arranged on an upper side of the optoelectronic semiconductor chip, a carrier having walls arranged on a surface of the carrier, the walls laterally limiting a receiving region, arranging an optoelectronic semiconductor chip in the receiving region, wherein a bottom side of the optoelectronic semiconductor chip faces the surface of the carrier, filling a region of the receiving region surrounding the optoelectronic semiconductor chip with an optically reflective material up to a height that lies between the upper side of the optoelectronic semiconductor chip and an upper side of the mask layer, removing the mask layer to create a free space in the optically reflective material, and introducing a wavelength-converting material into the free space.

Advantageously, the method allows for inexpensive production of an optoelectronic component with a wavelength-converting element embedded into an optically reflective layer. Thereby, the wavelength-converting element is formed by the wavelength-converting material. The optically reflective layer is formed by the optically reflective material.

Advantageously, the size of the wavelength-converting element is self-adjustingly adapted to the size of the optoelectronic semiconductor chip in an optimal manner during production according to the method. Moreover, the wavelength-converting element is self-adjustingly aligned above the optoelectronic semiconductor chip in an optimal manner.

The thickness of the wavelength-converting element may in the method advantageously be set in a flexible manner via the thickness of the mask layer and the height of the optically reflective material filled into the receiving region.

Advantageously, the wavelength-converting element formed by the wavelength-converting material is in the method produced with clearly defined outer edges end embedded into the optically reflective material with high precision.

A particular advantage of the method consists of the low rejection of material, i.e. low waste of material, which allows for the method to be carried out inexpensively.

Advantageously, the method involves extensive freedom when choosing the optically reflective material and the wavelength-converting material. Particularly, the method does not require the use of adhesive silicone, thus advantageously avoiding the disadvantages connected to the use of adhesive silicone.

A further advantage of the method is that it allows for control and, if necessary, belated adjusting of a color locus of the optoelectronic component available by the method already during execution of the method. As a result, color-locus fluctuations caused by production may advantageously be reduced or prevented. A detected color-locus deviation of a produced optoelectronic component may in this context be compensated for by introducing a further wavelength-converting material into the free space.

The method may comprise a further step of arranging an optically transparent casting material above the optically reflective material and the wavelength-converting material. Advantageously, the optically transparent casting material may mechanically protect the optoelectronic component obtained by the method.

The optically transparent casting material may comprise silicone. Advantageously, the optically transparent casting material may then be obtained inexpensively and processed in a simple manner.

The optically reflective material and/or the wavelength-converting material may comprise silicone. Advantageously, the optically reflective material and/or the wavelength-converting material may then be obtained inexpensively and processed in a simple manner.

The optically reflective material may comprise $TiO_2$. Advantageously, this confers good optically reflective properties to the optically reflective material.

Filling the region of the receiving region surrounding the optoelectronic semiconductor chip may be carried out by contact-free dosing (jetting). Advantageously, the method thereby allows for very precise dosing of the amount of the optically reflective material filled into the receiving region. Furthermore, filling the receiving region may thus advantageously be carried out with high spatial precision.

The wavelength-converting material may comprise an embedded luminescent substance. Advantageously, the luminescent substance embedded into the wavelength-converting material may absorb electromagnetic radiation having a wavelength emitted by the optoelectronic semiconductor chip and subsequently emit electromagnetic radiation of a different wavelength.

Introducing the wavelength-converting material into the free space may be carried out by needle dosing (dispensing). Advantageously, the method thus allows for a precisely dosed and spatially precisely oriented introduction of the wavelength-converting material into the free space.

The mask layer may be removed by dissolving. For example, dissolving the mask layer may be carried out by dissolving by water or by dissolving by a developer solution upon previous illumination of the mask layer.

If necessary, an additional cleaning step may be carried out after dissolving of the mask layer to remove residues of the mask layer. The additional cleaning step may, for example, comprise the use of plasma, $N_2$ or of pressurized air.

Provision of the optoelectronic semiconductor chip may comprise steps of providing a wafer having a plurality of optoelectronic semiconductor chips, arranging a mask layer on an upper side of the wafer, and singularizing the optoelectronic semiconductor chip. Advantageously, arranging the mask layer on the upper side of the optoelectronic semiconductor chip is thus carried out inexpensively for a plurality of optoelectronic semiconductor chips at the same time. Depositing the mask layer on the wafer also offers the advantage that the mask layer may be produced with high precision and lateral uniformity.

The mask layer may be produced by polyvinyl acetate (PVA) or photo resist. Advantageously, this allows for easy deposition and also for easy removal of the mask layer.

The optoelectronic semiconductor chip may be provided with a first electrical contact region arranged on the bottom side. Thereby, the carrier is provided with a first electrical contact pad arranged in the receiving region on the surface. When arranging the optoelectronic semiconductor chip in the receiving region, an electrically conductive connection is established between the first contact region and the first contact pad. Advantageously, the optoelectronic semiconductor chip of the optoelectronic component obtainable by the method may then be electrically contacted via the first contact pad of the carrier. Production of the electrically conductive connection between the first electrical contact region of the optoelectronic semiconductor chip and the first electrical contact pad of the carrier advantageously does not require extra method steps. Thus, the method may be carried out in a particularly inexpensive manner.

The optoelectronic semiconductor chip may be provided with a second electrical contact region arranged on the upper side. Thereby, the carrier is provided with a second electrical contact pad arranged in the receiving region on the surface. The mask layer is in this contact removed in the second electrical contact region of the optoelectronic semiconductor chip. After arranging the optoelectronic semiconductor chip in the receiving region, a wire-bond connection is produced between the second contact region and the second contact pad. Advantageously, the optoelectronic semiconductor chip of the optoelectronic component obtainable by the method may then be electrically contacted via the second electrical contact pad.

The carrier may be provided with a plurality of receiving regions arranged on the surface. Thereby, the method comprises a further step of dividing the carrier to obtain a plurality of optoelectronic components. Advantageously, the method thus allows for parallel production of a plurality of optoelectronic components. As a result, the production costs for each single optoelectronic component may advantageously be strongly reduced.

The carrier may be divided along parting planes extending through walls arranged on the surface of the carrier. Advantageously, the walls arranged on the upper side of the carrier then form parts of the housings of the optoelectronic components obtainable by the method.

The above-described properties, features and advantages as well as the manner in which they are achieved will become clearer in context with the following description of examples which will be explained in more detail in conjunction with the schematic views of the drawings.

FIG. 1 shows a schematic sectional view of a wafer 150 comprising a plurality of optoelectronic semiconductor chips 100. The wafer 150 is formed as a flat disc (wafer) in which the optoelectronic semiconductor chips 100 are arranged side-by-side in a lateral direction, for example, in a two-dimensional matrix arrangement. Each optoelectronic semiconductor chip 100 comprises an upper side 101 and a bottom side 102 opposite the upper side 101. The upper sides 101 of the optoelectronic semiconductor chips 100 jointly form an upper side of the wafer 150. The bottom sides 102 of the optoelectronic semiconductor chips 100 jointly form a bottom side of the wafer 150.

The optoelectronic semiconductor chips 100 may, for example, be LED chips. The optoelectronic semiconductor chips 100 may, for example, be light-emitting-diode chips provided to emit electromagnetic radiation (visible light) with a wavelength in the blue spectral range. The upper sides 101 of the optoelectronic semiconductor chips 100 in this context form radiation-emitting surfaces of the optoelectronic semiconductor chips by which electromagnetic radiation is emitted during operation of the optoelectronic semiconductor chips 100.

Figure 2:
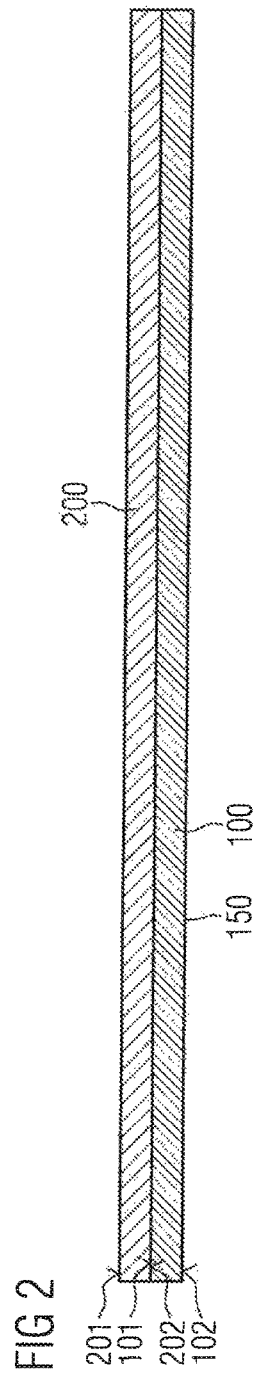
FIG. 2 shows the wafer with a mask layer arranged on an upper side.

FIG. 2 shows a further schematic sectional view of the wafer 150 in a processing status timely subsequent to the depiction of FIG. 1. On the upper side of the wafer 150 formed by the upper sides 101 of the optoelectronic semiconductor chips 100, a mask layer 200 has been deposited. The mask layer 200 comprises an upper side 201 and a bottom side 202 opposite the upper side 201. The bottom side 202 of the mask layer 200 is in contact with the upper sides 101 of the optoelectronic semiconductor chips 100 of the wafer 150.

The mask layer 200 may, for example, comprise polyvinyl acetate (PVA) or a photo resist. The mask layer 200 may have been arranged, for example, by spin-coating, spraying or by laminating a photo-resist film onto the upper side of the wafer 150. The mask layer 200 may also have been arranged on the upper side of the wafer by a photo mask. The thickness of the mask layer 200 between its upper side 201 and its bottom side 202 is preferably as constant as possible over the entire area of the wafer 150 and may, for example, be between a few μm and a few mm.

Figure 3:
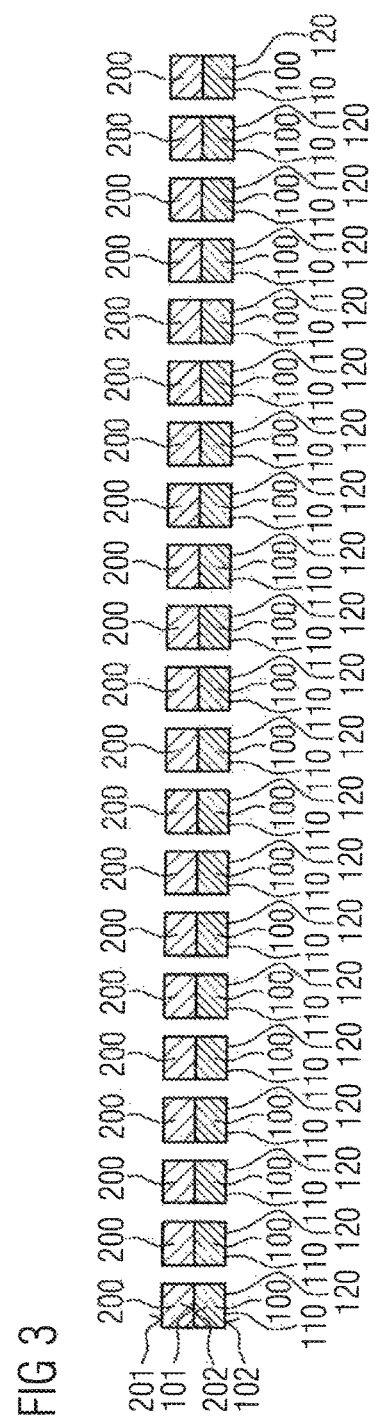
FIG. 3 shows the optoelectronic semiconductor chips after dissolving the wafer.

FIG. 3 shows a schematic sectional view of the optoelectronic semiconductor chips 100 in a processing status timely subsequent to the depiction of FIG. 2. The optoelectronic semiconductor chips 100 have been singularized by dividing the wafer 150. In this context, the mask layer 200 arranged on the upper side of the wafer 150 has been divided as well. On the upper side 101 of each optoelectronic semiconductor chip 100, a part of the mask layer 200 has been arranged. The parts of the mask layer 200 arranged on the upper sides 101 of the optoelectronic semiconductor chips 100 thereby essentially comprise the same lateral dimensions as the upper sides 101 of the optoelectronic semiconductor chips 100. The lateral flanks extending between the upper side 201 and the bottom side 202 of each part of the mask layer 200 are oriented perpendicular to the upper side 101 of the respective optoelectronic semiconductor chips 100 with high precision.

On the bottom side 102 of each optoelectronic semiconductor chip 100, a first electrical contact region 110 and a second electrical contact region 120 are respectively formed which electrically contact the optoelectronic semiconductor chip 100. The optoelectronic semiconductor chips 100 may, for example, be formed as flip-chips.

Figure 4:
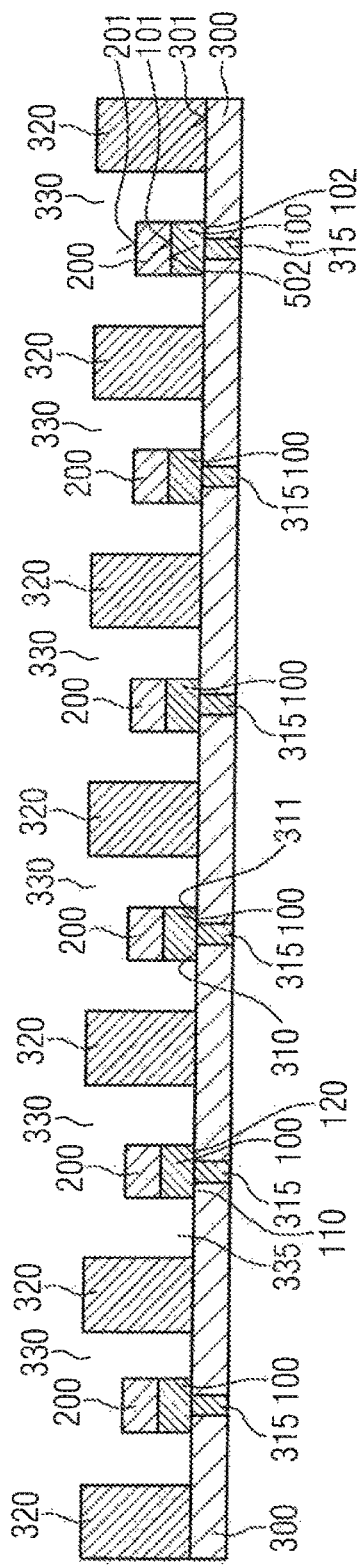
FIG. 4 shows a section through a carrier with optoelectronic semiconductor chips arranged in receiving regions.

FIG. 4 shows a schematic sectional view of a carrier 300. The carrier 300 is essentially in the form of a plane disc having a surface 301. The carrier 300 comprises an electrically conductive material, for example, a metal. The carrier 300 may also be referred to as leadframe.

On the surface 301 of the carrier 300, walls 320 are arranged which laterally delimit the receiving regions 330. The walls 320 form a two-dimensional grid on the surface 301 of the carrier 300. In the receiving regions 330, the surface 301 of the carrier 300 is respectively accessible.

In a lateral direction, the surface 301 of the carrier 300 may, for example, have a rectangular or circular-disc shape. The individual receiving regions 330 on the surface 301 of the carrier 300 preferably have a rectangular shape in a lateral direction.

In each receiving region 330, the carrier 300 is subdivided into a first electrically conductive section and a second electrically conductive section by a respective isolator 315 embedded into the carrier 300, the first and second section forming a first electrical contact pad 310 and a second electrical contact pad 311. The first electrical contact pad 310 and the second electrical contact pad 311 of each receiving region 330 are each electrically isolated from each other. Instead of the isolator 315, a gap may respectively be provided in the carrier 300 as well.

The walls 320 may, for example, comprise an epoxy resin, a silicone or a different material, each filled up to height. The walls 320 may have been produced, for example, by transfer molding.

In each receiving region 330 on the surface 301 of the carrier 300, an optoelectronic semiconductor chip 100 is arranged. The optoelectronic semiconductor chips 100 are each arranged such that the bottom side 102 of the optoelectronic semiconductor chip 100 faces the surface 301 of the carrier 300 and is in contact therewith.

In this context, in each optoelectronic semiconductor chip 100 the first electrical contact region 110 electrically conductively connects to the first electrical contact pad 310 on the surface 301 of the carrier 300 in the respective receiving region 330. The second electrical contact region 120 of each optoelectronic semiconductor chip 100 electrically conductively connects to the second electrical contact pad 311 of the respective receiving region 330 on the surface 301 of the carrier 300.

The upper sides 101 of the optoelectronic semiconductor chips 100 arranged in the receiving regions 330 of the carrier 300 and the mask layers 200 arranged on the upper sides 101 of the optoelectronic semiconductor chips 100 face away from the surface 301 of the carrier 300.

In a lateral direction, the receiving regions 330 of the carrier 300 each have a larger area than the upper sides 101 of the optoelectronic semiconductor chips 100 arranged in the receiving regions 330. The optoelectronic semiconductor chips 100 are preferably arranged in the receiving regions 300 in an approximately centered manner. As a result, each optoelectronic semiconductor chip 100 in its respective receiving region 330 is surrounded by a surrounding region 335 of the receiving region 330. The optoelectronic semiconductor chips 100 are thus distanced from the walls 320 delimiting the respective receiving region 330 in lateral directions parallel to the surface 301 of the carrier 300.

Figure 5:
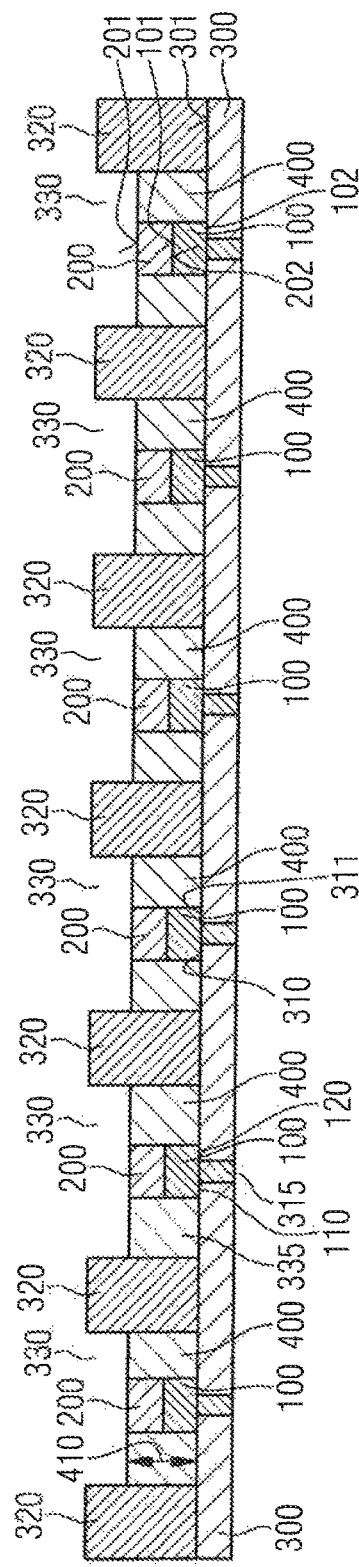
FIG. 5 depicts a section through the carrier after filling an optically reflective material into the receiving regions.

FIG. 5 shows a further schematic sectional view of the carrier 300 with optoelectronic semiconductor chips 100 arranged in the receiving regions 330 in a processing status timely subsequent to the depiction of FIG. 4. An optically reflective material 400 has been introduced into the regions 335 of the receiving regions 330 surrounding the optoelectronic semiconductor chips on the surface 301 of the carrier 300.

The optically reflective material 400 may have been introduced into the surrounding regions 335, for example, by jetting. The optically reflective material 400 may comprise an essentially optically transparent matrix material into which optically reflective particles have been embedded. The matrix material may, for example, comprise silicone. The optically reflective particles of the optically reflective material 400 may, for example, comprise $TiO_2$.

The optically reflective material 400 has been filled into the regions 335 of the receiving regions 330 surrounding the optoelectronic semiconductor chips 100 up to a height 410. The height 410 is measured from the surface 301 of the carrier 300 to the upper edge of the optically reflective material 400. The height 410 is preferably chosen such that the optically reflective material 400 filled into the surrounding regions 335 is approximately flush with the upper side 201 of the mask layer 200 on the upper side 101 of the optoelectronic semiconductor chip 100 arranged in the respective receiving region 330. The height 410 of the optically reflective material 400 filled into the regions 335 of the receiving regions 330 surrounding the optoelectronic semiconductor chips 100 may, however, also be chosen to be a little lower so that an upper edge of the optically reflective material 400 is in each receiving region 330 arranged a little below the upper side 201 of the mask layer 200 of the respective optoelectronic semiconductor chip 100. The height 410 is, however, higher than the thickness of the optoelectronic semiconductor chips 100 between their upper sides 101 and their bottom sides 102. The upper sides 201 of the mask layers 200 of the optoelectronic semiconductor chips 100 remain uncovered by the optically reflective material 400.

FIG. 6 shows a further schematic sectional view of the carrier 300 with the optoelectronic semiconductor chips 100 arranged in the receiving regions 330 in a processing status timely subsequent to the depiction of FIG. 5. The sections of the mask layer 200 arranged on the upper sides 101 of the optoelectronic semiconductor chips 100 have been removed. The removal of the mask layer 200 may, for example, have been carried out by dissolving the mask layer 200. For this purpose, for example, water or a developing fluid may have been used. The mask layer 200 may also have been illuminated prior to this step.

By removing the sections of the mask layer 200 arranged on the upper sides 101 of the optoelectronic semiconductor chips 100, free spaces 210 have been obtained above the upper sides 101 of the optoelectronic semiconductor chips 100 in the optically reflective material 400 arranged in the receiving regions 330 of the carrier 300. Thereby, a free space 210 is respectively arranged above the upper side 101 of each optoelectronic semiconductor chip 100. The position and shape of each free space 210 with high precision corresponds to the shape and position of the section of the mask layer 200 previously arranged in the respective region.

As a result, the free spaces 210 are very precisely arranged at the upper sides 101 of the optoelectronic semiconductor chips 100. The optically reflective material 400 delimiting each free space 210 has a clearly defined edge at the border of the respective free space 210, respectively.

FIG. 7 shows a further schematic sectional view of the carrier 300 with the optoelectronic semiconductor chips 100 arranged in the receiving regions 330 in a processing status timely subsequent to the depiction of FIG. 6. A wavelength-converting material 500 has been introduced into the free spaces 210 in the optically reflective material 400 arranged in the receiving regions 330. The wavelength-converting material 500 may have been introduced into the free spaces 210, for example, by dispensing. In each free space 210, an amount of the wavelength-converting material 500 has been introduced, essentially completely filling the respective free space 210.

The wavelength-converting material 500 arranged in the free spaces 210 in the optically reflective material 400 of the receiving regions 330 respectively forms essentially flat small plates having an upper side 501 and a bottom side 502 opposite the upper side 501. The bottom side 502 of the wavelength-converting material 500 is thereby arranged on the upper side 101 of the optoelectronic semiconductor chip 100 arranged in the respective receiving region 330. The upper side 501 of the wavelength-converting material 500 is approximately flush with the upper side of the optically reflective material 400 arranged in the respective receiving region 330. The thickness of the wavelength-converting material 500 in each receiving region 330 between its upper side 501 and its bottom side 502 thus results from the thickness of the part of the mask layer 200 previously arranged on the upper side 101 of the respective optoelectronic semiconductor chip 100 and the height 410 of the optically reflective material 400 filled into the region 335 of the receiving region 330 surrounding the optoelectronic semiconductor chip 100. On the upper side 501 of the wavelength-converting material 500, a certain meniscus may, however, be formed.

The small plates formed by the wavelength-converting material 500 advantageously have a precisely defined shape determined by the free spaces 210. In particular, the small plates formed by the wavelength-converting material 500 have clearly defined outer edges.

The wavelength-converting material 500 absorbs electromagnetic radiation of a first wavelength and emits electromagnetic radiation of a different, typically larger wavelength. Thus, the wavelength-converting material 500 converts a wavelength of electromagnetic radiation. In particular, the wavelength-converting material 500 converts a wavelength of electromagnetic radiation emitted by the optoelectronic semiconductor chips 100. For example, the wavelength-converting material 500 may convert light emitted by the optoelectronic semiconductor chips 100 and having a wavelength in the blue spectral range into white light.

The wavelength-converting material 500 may comprise an optically essentially transparent matrix material and an embedded luminescent substance. The matrix material may, for example, comprise silicone. The luminescent substance of the wavelength-converting material 500 may, for example, be an organic or an inorganic luminescent substance. The luminescent substance of the wavelength-converting material 500 may also comprise quantum dots.

The luminescent substance may be embedded into the matrix material of wavelength-converting material 500 with a homogeneous spatial distribution. However, in the wavelength-converting material 500 the luminescent substance may be deposited such that the luminescent substance is chiefly arranged in proximity to the upper sides 101 of the optoelectronic semiconductor chips 100. Thus, the luminescent substance of the wavelength-converting material 500 may serve to cool the optoelectronic semiconductor chips 100.

Figure 8:
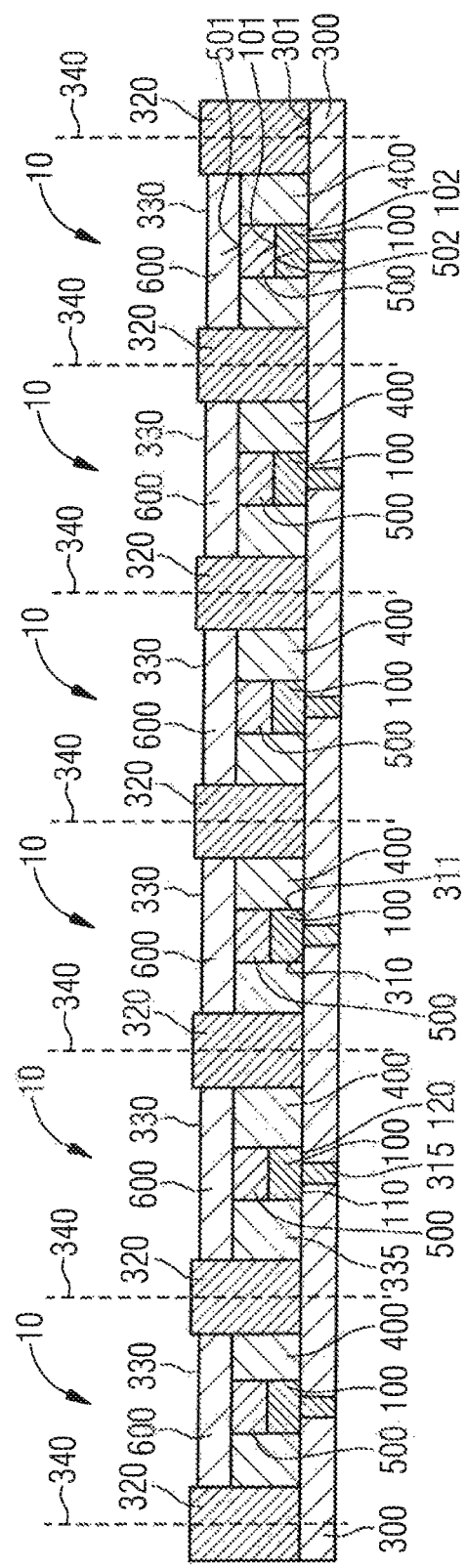
FIG. 8 shows a section through the carrier after filling a casting material into the receiving regions.

FIG. 8 shows a further schematic sectional view of the carrier 300 and of the optoelectronic semiconductor chips 100 arranged in the receiving regions 330 in a processing status timely subsequent to the depiction of FIG. 7. A casting material 600 has been arranged in the receiving regions 330.

In each receiving region 330 of the carrier 300, the casting material 600 has been arranged above the upper side 501 of the wavelength-converting material 500 and the upper side of the optically reflective material 400. The casting material 600 may, for example, comprise silicone. The casting material 600 serves to mechanically protect the wavelength-converting material 500 and the optically reflective material 400. The casting material 600 may also effect a beam formation of the light emitted by the optoelectronic semiconductor chip 100 arranged in the respective receiving region 330 and converted by the respective wavelength-converting material 500. However, the casting material 600 may also be omitted.

In a subsequent processing step, the carrier 300 may be divided along parting planes 340 extending perpendicular to the surface 301 of the carrier 300 and through the walls 320 to obtain a plurality of optoelectronic components 10. Each optoelectronic component 10 obtainable in such a way comprises a section of the carrier 300 with a receiving region 330. The receiving region 330 of each optoelectronic semiconductor chip 100 is laterally delimited by sections of the walls 320. In the receiving region 330 of each optoelectronic component 10, an optoelectronic semiconductor chip 100 is arranged. Above the upper side 101 of the optoelectronic semiconductor chip 100, the small plate formed by the wavelength-converting material 500 comprising the upper side 501 and the bottom side 502 is arranged, wherein the bottom side 502 of the small plate formed by the wavelength-converting material 500 abuts the upper side 101 of the optoelectronic semiconductor chip 100. The optoelectronic semiconductor chip 100 and the small plate formed by the wavelength-converting material 500 are jointly surrounded by the optically reflective material 400 filling the region 335 of the receiving region 330 surrounding the optoelectronic semiconductor chip 100 and the wavelength-converting material 500, and the upper side of which is essentially flush with the upper side 501 of the wavelength-converting material 500.

Our methods are explained and described in more detail in conjunction with the preferred examples. However, this disclosure is not limited to the disclosed examples. Rather, those skilled in the art may derive other variations therefrom without departing from the protective scope of the appended claims.

This application claims priority of DE 10 2013 212 928.9, the subject matter of which is herein incorporated by reference.

The invention claimed is:

1. A method of producing an optoelectronic component comprising:
   providing a wafer with a plurality of optoelectronic semiconductor chips;
   arranging a mask layer on an upper side of the wafer;
   singularizing the optoelectronic semiconductor chips to obtain one of the optoelectronic semiconductor chips having a mask layer arranged on an upper side of the optoelectronic semiconductor chip;
   providing a carrier having walls arranged on a surface of the carrier, the walls laterally limiting a receiving region;
   arranging the optoelectronic semiconductor chip in the receiving region, wherein a bottom side of the optoelectronic semiconductor chip faces the surface of the carrier;
   filling a region of the receiving region surrounding the optoelectronic semiconductor chip with an optically reflective material up to a height that lies between the upper side of the optoelectronic semiconductor chips and an upper side of the mask layer;
   removing the mask layer to create a free space in the optically reflective material; and
   introducing a wavelength-converting material into the free space.

2. The method of claim 1, further comprising arranging an optically transparent casting material above the optically reflective material and the wavelength-converting material.

3. The method of claim 2, wherein the optically transparent casting material comprises silicone.

4. The method of claim 1, wherein the optically reflective material and/or the wavelength-converting material comprises silicone.

5. The method of claim 1, wherein the optically reflective material comprises $TiO_2$.

6. The method of claim 1, wherein filling the region of the receiving region surrounding the optoelectronic semiconductor chip is carried out by contact-free dosing.

7. The method of claim 1, wherein the wavelength-converting material comprises an embedded luminescent substance.

8. The method of claim 1, wherein introduction of the wavelength-converting material into the free space is carried out by needle dosing.

9. The method of claim 1, wherein the mask layer is removed by dissolving.

10. The method of claim 1, wherein the mask layer is produced with polyvinyl acetate or a photo resist.

11. The method of claim 1, wherein the optoelectronic semiconductor chip is provided with a first electrical contact region arranged on the bottom side,
   the carrier is provided with a first electrical contact pad arranged in the receiving region on the surface, and
   when arranging the optoelectronic semiconductor chip in the receiving region, an electrically conductive connection is established between the first contact region and the first contact pad.

12. The method of claim 1, wherein the optoelectronic semiconductor chip is provided with a second electrical contact region arranged on the upper side,
   the carrier is provided with a second electrical contact pad arranged in the receiving region on the surface,
   the mask layer in the second electrical contact region is removed, and
   a wire-bond connection is established between the second contact region and the second contact pad.

13. The method of claim 1, further comprising dividing the carrier to obtain a plurality of optoelectronic components,
   wherein the carrier is provided with a plurality of receiving regions arranged on the surface.

14. The method of claim 13, wherein the carrier is divided along parting planes extending along the walls arranged on the surface of the carrier.

\* \* \* \* \*